United States Patent [19]

Miki et al.

[11] Patent Number: 4,786,417

[45] Date of Patent: Nov. 22, 1988

[54] MANAGEMENT OF PHOTORESIST MATERIALS CONTAINING WASTE SOLUTION

[75] Inventors: Kohei Miki; Hiroshi Saito, both of Kanagawa, Japan

[73] Assignee: Sumitomo Heavy Industries Ltd., Kanagawa, Japan

[21] Appl. No.: 76,372

[22] Filed: Jul. 22, 1987

[30] Foreign Application Priority Data

Jul. 23, 1986 [JP] Japan .................................. 61-171894
Jan. 17, 1987 [JP] Japan ..................................... 62-7449

[51] Int. Cl.$^4$ ............................................. B01D 13/00
[52] U.S. Cl. .................................... 210/639; 210/651; 210/195.2
[58] Field of Search ............ 210/650, 651, 737, 195.2, 210/181, 639

[56] References Cited

U.S. PATENT DOCUMENTS

| | | | |
|---|---|---|---|
| 4,111,803 | 9/1978 | Townend | 210/737 X |
| 4,171,265 | 10/1979 | Battigelli | 210/737 |
| 4,222,874 | 9/1980 | Connelly | 210/650 |
| 4,294,704 | 10/1981 | Daniel et al. | 210/651 |
| 4,595,498 | 3/1986 | Cohen et al. | 210/195.2 X |

FOREIGN PATENT DOCUMENTS

3143106 11/1983 Fed. Rep. of Germany .

OTHER PUBLICATIONS

IBM Technical Disclosure Bulletin, vol. 25, No. 8, Jan. 1983, p. 4359, "Ultrafiltration for Waste Treatment," S. R. Blanks et al.

Chemical Abstracts, vol. 104, No. 18, May 5, 1986, p. 396, Abstract No. 155202g, U. Von Mylius et al.

*Primary Examiner*—Frank Spear
*Attorney, Agent, or Firm*—Stewart L. Gitler; Charles W. Fallow; Martin P. Hoffman

[57] ABSTRACT

There is provided management of a photoresist resin containing waste solution discharged from printed circuit boards manufacturing process, printing industries, a semiconductor manufacturing industry and the other industries using photoresist materials. The photoresist resin containing waste solution is subjected to an ultrafiltration of the specified characteristics so as to separate definitely organic waste materials having relatively higher molecular weight which should be disposed from an effective and useful components contained in a permeate to be recycled or recovered resulting very efficient processing. Further, the inventive process provides useful management of the waste solution containing photoresist materials as dissolved, in which the dissolved photoresist materials in the waste solution is concentrated by an ultrafiltration of the specified characteristics, and further, the photoresist materials in the waste solution is cured or polymerized by exposing to radiation or heat energy, and the cured solid is yielded incorporating the polymerized materials and water. The inventive process provides the process of the management of the waste solution containing the photoresist materials comprising mainly the proceding step of ultrafiltration of the waste solution to separate a clean solution or permeate to be recycled to the process from the concentrated waste solution, and the succeeding step of forming a solidified materials by exposing the concentrated solution yielded in the preceding step to electomagnetic radiation and/or heat energy, which energy can be obtained from the burning of the resulting solidified materials, through effecting polymerization of waste photoresist materials in the concentrated waste solution.

4 Claims, 4 Drawing Sheets

○ : REJECTION OF PHOTORESIST MATERIAL FROM WASTE SOLUTION A
● : REJECTION OF PHOTORESIST MATERIAL FROM WASTE SOLUTION B
◉ : REJECTION OF SODIUM COMPONENT FROM SOLUTION C
⊘ : REJECTION OF KOH COMPONENT FROM SOLUTION D

- ● : TOC OF WASTE SOLUTION FROM DEVELOPING PROCESS
- ○ : TOC OF PERMEATE
- ◐ : Na CONTENT IN REGENERATED DEVELOPING SOLUTION

MANAGEMENT OF PHOTORESIST MATERIALS CONTAINING WASTE SOLUTION

FIELD OF THE INVENTION

The present invention relates to management of a photoresist resin containing waste solution discharged from printed circuit boards manufacturing process, printing industries, a semiconductor manufacturing industry and the other industries using photoresist materials. Particularly, it relates to treatment of photoresist resin containing waste solution in which the photoresist resin containing solution can be treated in a simple process so as to regenerate a developing solution or a stripping solution to be used, for example, in the printed circuit boards manufacturing industries, by the recycling of the solution. Further, it relates to a process of the management of the waste solution containing photoresist materials as dissolved, in which the dissolved photoresist materials in the waste solution is concentrated by an ultrafiltration of the specified characteristics, and further, the photoresist materials in the waste solution is cured or polymerized by exposing to radiation or heat energy, and the cured solid is yielded incorporating the polymerized materials and water. The inventive process provides the process of the management of the waste solution containing the photoresist materials comprising mainly the preceding step of ultrafiltration of the waste solution to separate a clean solution or permeate to be recycled to the process from the concentrated waste solution, and the succeeding step of forming a solidified materials incorporating the some polymerized materials and water, by exposure to electromagnetic radiation and/or heat energy.

DESCRIPTION OF THE PRIOR ART

The conventional management of the photoresist resin containing waste solution from the printed circuit boards manufacturing factory does not carry out any recovery of the photoresist containing solution and only involves a whole treatment of the all quantity of the waste liquor. The waste solution discharged from the developing process and the stripping process of a print-circuit board manufacturing industry is alkaline solution dissolving water soluble photoresist material at the high concentration, and therefore, it has higher COD (Biochemical Oxygen Demand), for example, 5,000 to 10,000 mg/l and then, higher BOD (Biochemical Oxygen Demand), for example, 1,000 to 3,000 mg/l. The treatment of such waste solution to produce harmless liquid requires the very complicated system for management of photoresist resin containing waste and raises the cost of the treatment process.

Among the prior art, the conventional techniques can be classified into two categories: one is the biological treatment by the steps of acid-addition—biological treatment—absorption in active carbon. (Japanese Laid-open Patent Publication No. 50-4850 discloses an active sludge treatment), and the other one is the separation by reverse osmosis membrane (see Japanese Laid-open Patent Publication No. 60-28881). The conventional biological treatment comprises reducing the pH of the waste solution to be treated by the addition of acid so as to make the dissolved photoresist material insoluble, and separating the precipitated solid from the solution, neutralizing the solution by adding an alkalizing agent, diluting the solution to reduce the solubility of the organic materials, and then biological treating followed by filtration and absorption on active carbon particles. This process requires a large volume of the acid and alkalizing agent, and further a large volume of diluting water tens times of the volume of the waste solution to be treated, and requires a large scale of the treatment equipment which will raise very much the cost of the management of the waste solution. Further, the biological treatment has a low treatment efficiency, and the COD removal is as much as below 50 percent, and the maintenance will not be easy. The absorption with active carbon is required as to reduce further more the COD to satisfy the allowance to enable discharging the treated waste solution to river and public water area, which will raise the loading of the active carbon absorption and, therefore, raise the cost of the treatment.

The separation by using reverse osmosis membrane can not keep the concentration of the photoresist material in the waste solution higher, because the waste solution contains inorganic material in the extent of 2 percent in order. The raise of the concentration of the photoresist in the waste solution being treated to the extent of about 5 times of the original waste one is a practical limit because of the raise of the osmosis pressure. Therefore, the one fifth of the waste solution will remain as a concentrated solution to be disposed. The treatment system by using the reverse osmosis membrane will be costly, and there is problems in the practical reliability to be improved. The waste solution abandoned from a developing process and a stripping process in the printed circuit boards manufacturing industries is an alkaline solution in which water soluble photoresist material and an anti-foaming agent are dissolved. Such waste solution contains higher COD and BOD and therefore, will require complicated system of the treatment of the waste solution and higher cost for the treatment.

Hitherto, the waste solutions from the developing process and stripping process, which may contain costly components have been combined and treated in all.

SUMMARY OF THE INVENTION

The present invention is in one aspect based on the findings that the dissolved photoresist materials can be concentrated by an ultrafiltration membrane of the specific characteristics so as to produce a clean permeate passing through the ultrafiltration membrane, which can be used and recycled for the solution usable in the process for developing and stripping the photoresist layer, and the photoresist materials can be easily concentrated in the waste solution by the ultrafiltration, and the resulting concentrated photoresist materials can be easily polymerized to form the solidified substance by exposure to the electromagnetic radiation.

It is an object of the present invention to provide a novel method of the economical treatment of such waste solution containing dissolved photoresist materials, which is based on the new concept.

It is another object of the present invention to provide the treatment of the waste solutions containing the photoresist materials discharged from each of a developing process and a stripping process, by which developing solution and stripping solution can be regenerated and recycled.

It is further object of the present invention to provide the process of the management of the waste solution containing photoresist materials as dissolved, in which the polymers dissolved from the photoresist by the treatment with the alkaline solution can be removed by an ultrafiltration of the specified characteristics, and further, the photoresist materials in the densified solution can be cured or polymerized by exposing to radiation or heat energy, and the cured solid can be easily removed.

It is further object of the present invention to provide the process of the management of the waste solution containing the photoresist materials comprising mainly the preceding step of ultrafiltration membraneing the solution to separate the clean solution to be recycle from the waste densified solution, and the succeeding step of forming a deposit of the photoresist materials by exposure to electromagnetic radiation and/or heat energy.

It is furthermore object of the present invention to provide the process of the management of the waste solution, by which the total volume of the waste to be disposed can be significantly reduced and the cost of the waste can be significantly reduced.

It is further object of the present invention to provide the process of the management of the waste solution to produce a completely harmless waste to be disposed.

It is an object of the present invention to provide the process of the management of the waste solution without any need of chemicals to be added for making the waste harmless.

It is other object of the present invention to provide the process of the management of the waste solution, yielding as a final product a self-burning (incineratable) substance, which does not necessitate the separation of the solid substance from the solution.

It is furthermore object of the present invention to provide the process of the management of the waste solution, in which the resulting self-burning product can be further used to heat the waste solution, which can make the process more economical.

It is an object of the present invention to provide the process of the management of the waste solution, which can be quite uncostly and will take shorter period of time.

DETAILED DESCRIPTION OF PREFERRED EMBODIMENTS

Figure 1A:
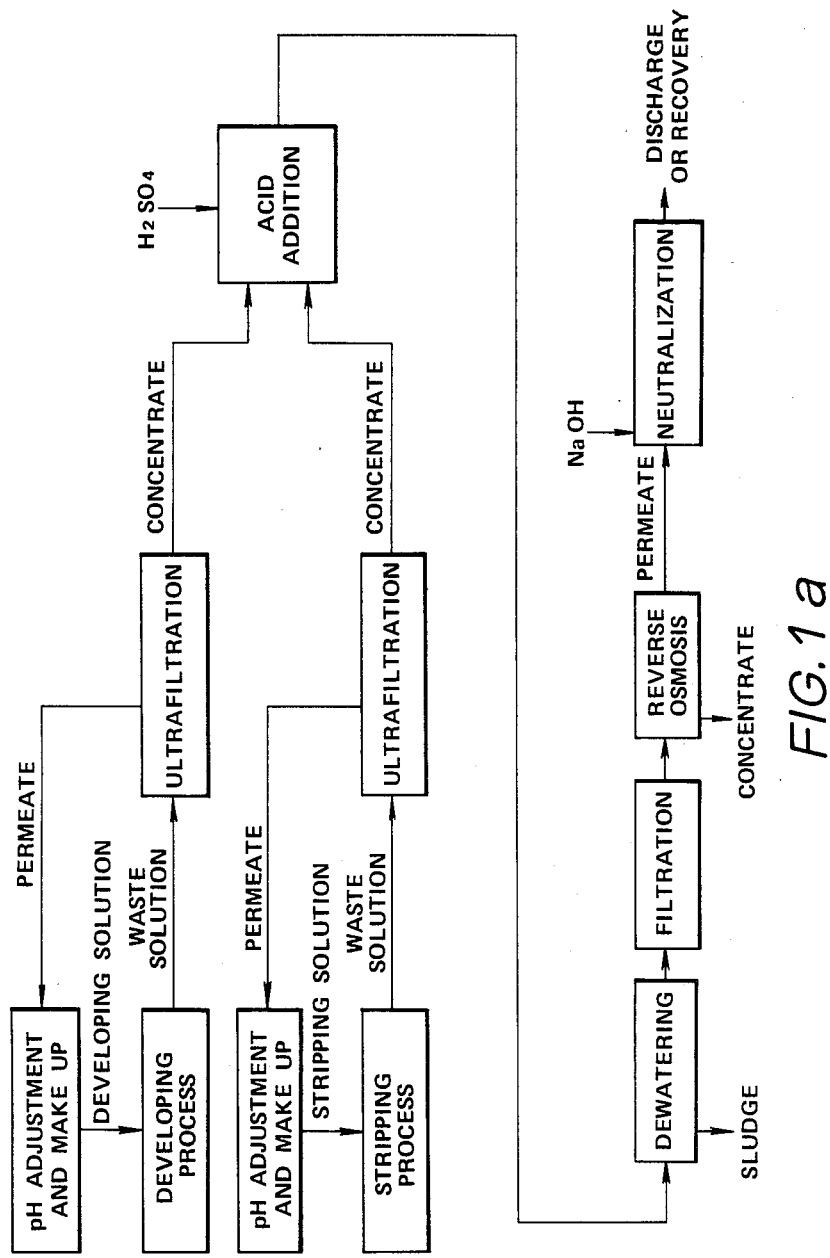
FIGS. 1a and 1b show schematically typical two systems for the management of the photoresist materials containing waste solution discharged from each of developing process and stripping process in a printed circuit boards manufacturing industries in accordance with the present invention.

A photoresist is a photosensitive film applied over a support or a substrate, which is exposed to light or radiation and developed before etching. The exposed parts thereof function to protect against etching action. For example, a photoresist is applied for the production of circuit patterns on a printed circuit boards. Further, photoresist techniques are used to manufacture a printing matrix for printing industries, a semiconductor pattern on a semiconductor device, and a variety of patterns used on various electronic devices. Accordingly, the volumes of photoresist materials are used in various industries and therefore, the wastes containing photoresist material are discharged from various processes such as a developing process, a stripping process and the other treating process to dissolve photoresist materials formed on or over a support or a substrate.

The materials used for photoresist may include polymer(s) to form photoresist mask or layer, photosensitive monomer or oligomer as a cross-linking agent, photo-polymerization initiator, stabilizer if necessary, and coloring agent. The polymer(s) to form photoresist mask or layer may have acrylic acid ester, methacryl acid, itaconic acid and maleic acid as a copolymerizable component, and further carboxyl group as a side chain. The cross-linking agent may be monomer or oligomer which may have acryloyl group or methacryloyl group. The photo-polymerization initiator may be anthraquinone analogue, benzophenone analogue, and benzoyl ether analogue. The stabilizer may be hydroquinone. The coloring agent may be a dye stuff such as blue coloring matter and green coloring matter.

It could be understood that when ultra violet light is applied to a photosensitive layer of the photoresist, the photo-polymerization initiator would generate radicals by the reaction responding to photon, then those radicals would react with the linking agent to produce a chain reaction of photo-polymerization. The extent of the linkage will raise to a certain level so that the photoresist becomes insoluble to a developing solution. Therefore, it could be understood that the photoresist material that can be indicated by the formula: R—COOH would be dissolved in a developing solution by substituting H group in the photoresist material with Na ion in the developing solution and forming Na salt in the solution. Further, in a stripping process, it could be understood that the photoresist materials remaining on the substrate would be partly dispersed, and partly dissolved in the solution upon stripping.

In accordance with the present invention, the photoresist material containing solutions discharged from each of a developing process and a stripping process and a treating process using photoresist material can be treated to regenerate and recycle the solution respectively to each of the original treating processes. Such treating processes are used in printed circuit boards manufacturing industries, semiconductor manufacturing industries, printing industries and the other industries for production of the desired pattern or image on a surface of the work piece.

In accordance with the present invention, the waste solution is subjected to a ultrafiltration, and the solution passing through the ultrafiltration membrane can be recycled to the original process. The part of the solution remaining over the ultrafiltration membrane, and not passing through the ultrafiltration is concentrated (or densified), or the concentration of the photoresist material is raised. The resulting concentrated solution is exposed to electromagnetic radiation such as sun light, or/and subjected to heat energy so as to accelerate polymerization of the photoresist material dissolved in the waste solution to thereby produce the solid of the polymerized (or cured) material. In the aspect of the present invention, further, the resulting solid is burned to heat the photoresist material containing waste solution thereby evaporating water from the solution and accelerating the polymerization of the photoresist material in the solution.

Hitherto, each of the waste solutions discharged from each of the processes for manufacturing are combined and treated in all. In contrast, in accordance with the present process of waste treatment, each of the waste solutions from each of the processes is respectively treated so as to concentrate (or densify) the solution into about one tenth to one twentieth of the original volume of the waste solution. Therefore, the volume of the waste solution to be treated and finally disposed will be drastically reduced. The alkalizing agent contained in the waste solution such as from a developing process and from a stripping solution can be mostly recovered and reused as in a permeate passing through an ultrafiltration membrane. The concentrated part of the waste solution remaining above the ultrafiltration membrane is exposed to electromagnetic radiation such as sun light and/or subjected to heating so as to accelerate the polymerization of the photoresist materials in the solution. The resulting solidified substance of the polymerization can easily disposed in a final step. Further, the resulting solid can be burned so that the burning heat can be used to heat more effectively the solution to thereby densify the solution or to accelerate the polymerization. Accordingly, the inventive process is very economical and produce harmless waste from the waste solution.

Figure 1B:
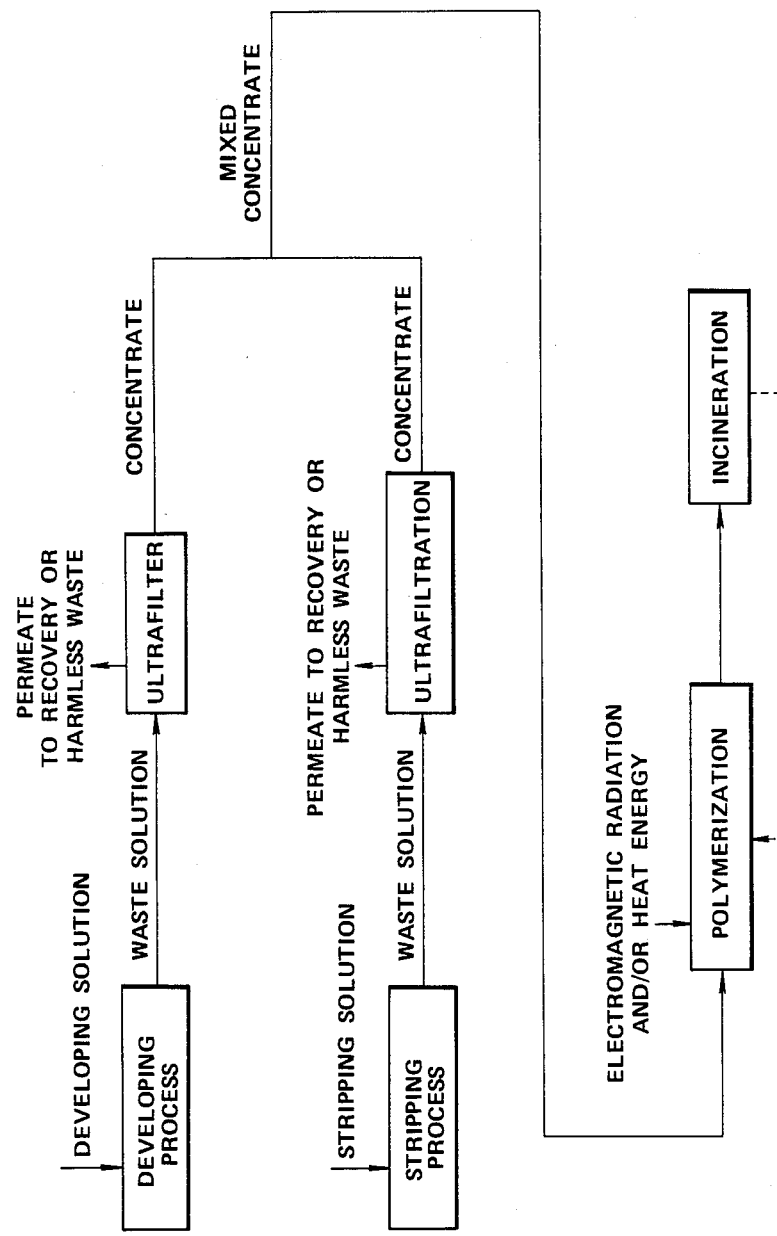

The system for the process of treatment of a photoresist material containing waste solution in accordance with the present invention is schematically shown in FIGS. 1a and 1b.

In accordance with the present invention, the waste solution containing photoresist material dissolved in a developing solution used in the developing process, or an stripping solution used in the stripping process is each subjected to an ultrafiltration, retaining alkaline condition. The part of the solution passing through the ultrafiltration membrane is mostly free from the photoresist materials and contains effective materials such as alkalizing agent and, therefore, can be recycled to the each original process. In case of the treatment of the waste solution from the developing process, the photoresist material does not pass through the ultrafiltration membrane and remain in the concentrated solution over the ultrafiltration membrane, and then, is drawn off out of the recycling system. Useful components such as an alkalizing component can pass through the ultrafiltration membrane and return to the developing solution to be again used for developing a photoresist cover on the substrate. In case of the treatment of the waste solution from the stripping process, the part of the solution passing through the ultrafiltration membrane is again used to strip the photoresist layer remaining on the substrate after etching step. In the both cases, the part of the solution remaining over the ultrafiltration membrane is concentrated in the concentration of the photoresist material dissolved, and the volume of such concentrated solution is one tenth to one twentieth of the original volume of the waste solution.

The waste solution containing the soluble photoresist materials to be treated in accordance with the present invention is an alkaline aqueous solution containing $Na_2CO_3$, NaOH and/or KOH in the amount of 1 to 2%. Such waste solution is subjected to the ultrafiltration with an ultrafiltration membrane having a cut-off molecular weight of 5,000 to 100,000. The content of the dissolved photoresist materials is densified or concentrated from 1.5 weight % into 15 weight % to 30 weight %. On the other hand, an inorganic alkalizing agent having a lower molecular weight and functioning to dissolve the photoresist material is not concentrated any more, and the content thereof in the concentrated waste solution is as much as 1 to 2%.

The nominal cut-off molecular weight of the ultrafiltration membrane would be refered to as the power of rejecting 90% of the material having the known molecular weight by the tested ultrafiltration membrane, with measuring with PEG or dextrane of the known molecular weight. The ultrafiltration membrane in practice has some range for the nominal cut-off molecular weight that corresponds to the range of pore size formed in the membrane.

In general, a developing solution may be an aqueous solution of 1 to 2 weight % $Na_2CO_3$ containing 0.1 to 0.5 volume % of polyalkylene glycol as an antifoamer. A stripping solution used in general may be an aqueous solution of 1 to 5 weight % NaOH or KOH, containing 0.1 to 0.5 volume % of polyalkylene glycol as an antifoamer.

The condition of enabling the treatment of the waste solution from the solution used in the print circuit is depending on the suitable combination of the characteristics of the ultrafiltration membrane, with the composition of the waste solution. The ultrafiltration membrane in use for the treatment of the waste solution in accordance with the present invention should satisfy the following conditions:

(1) The ultrafiltration membrane should be resistant to alkaline, because the waste solution to be treated is alkaline:

(2) The cut-off molecular weight should be in the range of about 5,000 to 100,000, depending on the composition of the waste solution, and therefore, the inorganic dissolved material will pass through the ultrafiltration membrane, and the photoresist material will be concentrated in the solution over the ultrafiltration membrane.

The claimed range is specified in view of the characteristics of the waste solution from the developing process or the stripping process, so as to carry out effectively the inventive management of the waste containing photoresist material. In general, an ultrafiltration membrane can remove a dissolved substance (solute) having the given molecular weight. The ultrafiltration membrane usable for the inventive process of the treatment of the waste solution should be adapted to remove effectively the photoresist materials from the solution. In the other words, the usable ultrafiltration membrane should be good at power of removing. The "power of rejecting" is defined as referring to the reduction of the concentration of the dissolved substance in the solution passing through the used ultrafiltration membrane, from that thereof in the waste solution before the treatment. In the other words, it can be referred to as the ratio of the concentration of the dissolved substance remaining over the used ultrafiltration membrane to that formed in the waste solution before the treatment.

This rejecting power to the photoresist materials was tested by measuring the rejecting power of the ultrafiltration membrane to the waste solution containing an inorganic alkalizing agent and the photoresist materials. The result is shown in FIG. 2.

Figure 2:
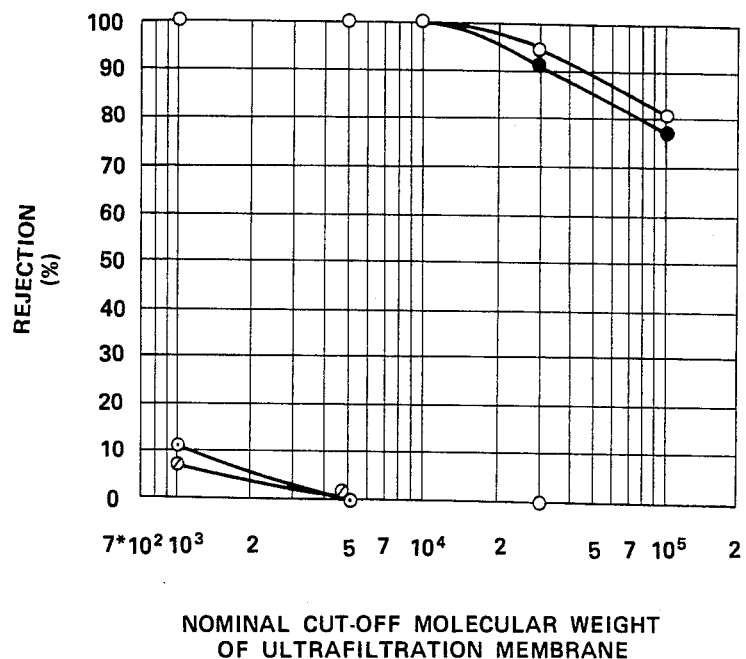
FIG. 2 is a graph showing removal performance of an ultrafiltration membrane to filtrate the photoresist material.

FIG. 2 is a plot of the rejecting power against the cut-off molecular weight of the used ultrafiltration membrane in indicating (1) the rejection of photoresist materials in the waste solution A from a developing process obtaining 0.2 m²/l of the photoresist material, and 1 weight % of Na₂CO₃:

(2) the rejection of photoresist materials in the waste solution B from a stripping process containing 0.3 m²/l of the photoresist material, and 2 weight % of KOH:

(3) the rejection of sodium component (NaHCO₃, NaOH etc.) in the solution C containing 1 weight % of Na₂CO₃:

(4) the rejection of KOH component in the solution D containing 2 weight % of KOH:

The ultrafiltration membranes used for measuring the data of FIG. 2 are these available from Nippon Milipore Ltd. and Sumitomo Heavy Industries Ltd. that are manufactured from polysulfone on an appropriate support.

It is evident from FIG. 2 that the range of the cut-off molecular weight of the ultrafiltration membrane in which almost 100% of photoresist material can be removed and most of alkalizing component can be recovered resides in the range of 5,000 to 10,000.

The practical level for the developing power and the stripping power of the solution to be recycled in accordance with the present invention can be fixed lower than the level of the fresh solution. In this case, it can allow the leakage of the photoresist material from the waste solution to the permeate to a limited extent, and the preferable range of the molecular weight of the ultrafiltration membrane is 5,000 to 100,000. Further, in accordance with the present invention, the volume of the fresh solution corresponding to the volume of the concentrated solution over the ultrafiltration membrane is added to the permeate solution to be recycled to each of the processes so as to resupply the same volume as that of the original solution. In this processing, the photoresist content in the generated solution to be recycled is diluted by the added fresh solution and would be saturated to a certain level of the content of the dissolved photoresist materials in a longer period of time.

The preferable ultrafiltration membrane having the cut off molecular weight ranging 5,000 to 100,000 can densify or concentrate most of the photoresist materials in the waste solution and let the alkalizing component pass through. The effective component, that is, the alkalizing component can be economically recovered by using the ultrafiltration membrane of such characteristics. On the other hand, the photoresist materials can be removed in form of the condensed solution which can be easily disposed. The range of the cut-off molecular weight of 5,000 to 100,000 corresponds to the average pore size of 0.002 to 0.05 micrometer formed in the ultrafiltration membrane. Therefore, the very fine particles which are harmful to the production of semiconductor device can be effectively removed in the inventive process of the treatment of the waste solution so as to recycle to the solution usable in the production of the semiconductor device. This is one of the advantages of the inventive process.

The ultrafiltration membrane module applicable in accordance with the present invention may be composed of as a membrane material inorganic material of metal oxide such as zirconium dioxide, polysulfone material, polyimide material, and acryl nitryl material which can constitute a membrane form on an appropriate support for making an ultrafiltration membrane. The configuration may be preferably of tubular type. The cut-off molecular weight of the ultrafiltration membrane can be adjusted by controlling the ratio of solvent in a coating material when applying a coating material to the support so as to form the ultrafiltration membrane or the other way such as controlling the temperature or the other condition for the treatment to manufacture the membrane. The support material for the membrane may be carbon sintered body or aluminium silicate sintered body or the other formed passive body.

The following table 1 shows the pH of; and the components contained in;

(1) a developing solution used in a developing process for removing a photoresist after the exposure of a water soluble photoresist resin to radiation;

(2) a waste of the developing solution after exerting the developing treatment, to be treated;

(3) a permeate: or a solution of the developing waste, passing through an ultrafiltration;

(4) a concentrated waste solution over the ultrafiltration membrane; and (5) a stripping solution used in a stripping process for stripping the photo-cured (polymerized) photoresist resin after etching a conductive film (metal) for the production of printed circuit boards;

(6) a waste of the stripping solution solution after exerting the stripping treatment;

(7) a permeate: or a solution of the stripping waste, passing through an ultrafiltration; and (8) a concentrated waste solution over the ultrafiltration membrane;

TABLE 1

| process | solution | components contained in solution | pH |
|---------|----------|----------------------------------|-----|
| developing | (1) developing | inorganic alkalizing agent, antifoamer | 11.5 |
|  | (2) waste | uncured photoresist, inorganic alkalizing agent, antifoamer | 10.5 |
|  | (3) permeate | inorganic alkalizing agent, antifoamer | 10.5 |
|  | (4) concentrated | uncured photoresist, inorganic alkalizing agent, antifoamer | 10.5 |
| stripping | (5) stripping | inorganic alkalizing agent, antifoamer | 14.5 |
|  | (6) waste | cured photoresist, inorganic alkalizing agent, antifoamer | 13.5 |
|  | (7) permeate | inorganic alkalizing agent, antifoamer | 13.5 |
|  | (8) concentrated | cured photoresist, inorganic alkalizing agent, antifoamer | 13.5 |

It is necessary to adjust the pH of the solution to be recycled to the developing process, by supplementing an alkalizing component to, because the alkalizing component in the solution have been consumed in the prior developing process to reduce the pH of the solution, and the content of the alkalizing component in the recycled solution is insufficient to further develop when the waste solution is treated by an ultrafiltration to yield the part of the solution passing the ultrafiltration membrane which is used to recycle to the developing solution used in the developing process. Further, when the inventive treatment of the waste solution containing photoresist material is applied to the stripping process, the solution which is to be recuycled to the original stripping process is necessarily adjusted in the pH value in the similar way.

(1) NaOH be resupplied to adjust the pH of the developing solution to be recycled. However, if Na ion concentration is too high, the photoresist that must be dissolved in the stripping process is possibly dissolved in the preceding developing process.

In the inventive treatment of the waste solution, the accumulation of Na ion in the recycled solution can be avoided in the following way.

$Na_2CO_3$ dissociates as follows in the developing solution;

$$Na_2CO_3 + H_2O = NaHCO_3 + NaOH$$

Photoresist material (it is indicated by the formula: R—H) can be dissolved as follows:

$$Na_2CO_3 + H_2O \rightarrow NaHCO_3 + NaOH$$

$$NaH + R—H \rightarrow R—Na + H_2O$$

As this reaction progresses, the NaOH is consumed, and the amount of $HCO_3-$ is increased, and therefore, the power of dissolving is gradually lowered.

When the power of dissolving the photoresist materials is lowered to the out of the allowance, the solution is discharged to be subjected to the ultrafiltration. The part of the solution passing through the ultrafiltration membrane is mostly free from the photoresist materials dissolved, and contains only most of inorganic alkalizing component(s).

When NaOH is added to the solution passing through the ultrafiltration membrane until the pH value becomes the original pH value before dissolving the photoresist material (pH=11.5 in the case shown in Table 1), the following reaction progresses as shown in the arrow:

$$Na_2CO_3 + H_2O \leftarrow NaHCO_3 + NaOH$$

It shows that if the amount of NaOH is increased, the equilibrium makes the left side heavy and $CO_3^{2-}$ ion is increased, which makes the solution fresh and regenerated.

Further, the fresh developing solution is resupplied to the recycled solution in the amount corresponding to the loss of the solution which is the amount of the concentrated (densified) waste solution to be treated further. Accordingly, the volume of the waste solution to be discharged can be regenerated and recycled without the accumulation of Na ion in the solution, and without any fluctuations in the volume of the solution.

(2) The composition adjustment of the solution to be recycled in accordance with the present invention for the stripping process in the printed circuit boards manufacturing industries can be well done by adding the solution of NaOH or KOH to adjust pH at about 14.

(3) The concentration (densification) magnitude of the waste solution by subjecting to the ultrafiltration in accordance with the present invention will depend on the economical factors such as the rate of the solution passing through the ultrafiltration membrane, and is preferably ten times to twenty times in practice.

In accordance with the present invention, the waste solutions discharged from both of a developing process and a stripping process in the print circuit manufacturing factory are respectively subjected to an ultrafiltration, and each of the permeates, that is, the parts of the solutions passing through the ultrafiltration membrane are returned or recycled to each of the original processes, that is, the developing process or the stripping process, and further, the parts of the solutions concentrated above the ultrafiltration membrane are mixed or separately treated as shown in FIGS. 1a and 1b. The waste solution is treated as shown in FIGS. 1a and 1b.

In accordance with the present invention, each of the waste solutions from the developing process and the stripping process is independently and separately treated so that the each part of the solution passing through the ultrafiltration membrane is individually returned or recycled to each of the original processes, or the developing process or the stripping process, and each of the concentrated solution over the ultrafiltration membrane is mixed so as to be treated further. Then, the mixed concentrated waste solution is treated in the following scheme, which constitute one aspect of the present invention.

Subsequent to the above described recovery process, the concentrated solution is treated as shown in FIG. 1a, in the other words, neutralized by adding acid, and dewatered (hydro-extracted) with removal of dewatered sludge, filtered. Further, reverse osmosis, active carbon absorption, or biological treatment can be applied as a final step following the above procedure.

Alternatively, the concentrated solution can be treated as shown in FIG. 1b, which constitutes one aspect of the present invention. The concentrated photoresist materials or its decomposed organic materials are cured or polymerized to form the solidified substance or solid by applying electromagnetic radiation or heat energy to the concentrated solution. This procedure is very economical. Such procedure is significantly effective particularly to the solution concentrated by the ultrafiltration in accordance with the present invention. The function of this procedure is described as follows.

The waste solution containing photoresist material contains further alkaline components used for dissolving the photoresist material, but the photoresist materials in general will be polymerized under acidic condition such as below pH of 6 so as to solidify the concentrated waste solution. The solution concentrated by the ultrafiltration in accordance with the present invention is rich in the photoresist materials, and therefore, the photoresist materials dissolved and concentrated in the waste solution can be polymerized even in the alkaline solution so as to form the solidified substance incorporating water, and without any addition of acid nor agent, it can be polymerized by exposing to the electromagnetic radiation or heat energy. The polymerization begins to occur at the level of 50 to 60 weight % in its concentration. The polymerization can occur even incorporating water, and therefore, the reaction does not require the separation step of separating photoresist materials from the solution after the polymerization.

The following condition should be satisfied in order to carry out easily and economically the polymerization of the photoresist materials in the solution only by exposing the solution to electromagnetic radiation such as the sun light, and/or to heat energy.

The condition is that the concentrated solution should be at the lower level of the content of inorganic components such as an alkalizing component, and the essential components as dissolved are the photoresist materials.

As shown in FIG. 1b, the waste solutions from the developing process and the stripping process are individually subjected to the ultrafiltration, and the each part (permeate) of the solution passing through the ultrafiltration membrane is recycled to each the process, or to produce harmless waste solution, and on the other hand, the solution concentrated of the photoresist material over the ultrafiltration membrane is exposed to the sun light so as to effect the polymerization of the photoresist materials. The polymerization can be accelerated by an artificial light, not only by the sun light. The heat energy can be applied further to evaporate water from the solution, or to densify the solution, thereby accelerating the polymerization to produce the solidified substance incorporating water therein.

The operation condition should be selected depending on the modification of the species and the concentration of the photoresist materials to be treated and the composition of the waste solution by controlling the alkaline adjustment, and the species and the number of the ultrafiltration membrane. The filtration of the waste solution by the ultrafiltration membrane gives the ten times to twenty times concentration of the solution, and the concentration of the photoresist materials including the decomposition thereof becomes 15% to 30% by weight. In view of the foregoings, the inventive process of the management of the waste solution containing the photoresist materials is very simple and economical without any need of the chemicals to be added and can give a complete harmless waste to be disposed.

In order to effect polymerization in the waste solution to produce the self-burning solid, the contents of the solute(s) like an alkalizing component should be at the lower level, and further, the concentrations of the photoresist materials should be at the level of about ten weight % which is corresponding to the densification (concentration magnitude) of about ten times from the original waste solution. This concentration of the photoresist materials in the waste solution can be effected only by subjecting to the ultrafiltration in the previous step, so as to exclude only the photoresist materials from the permeate of the ultrafiltration, in the other words, to do an effective densification of the solution. It is important and effective to remove a lower molecular weight components except of the photoresist materials, and to keep the concentration of the photoresist materials at the higher level.

The photoresist materials dissolved in the waste solution can be polymerized or cured only by exposing the solution to an electromagnetic radiation and/or heat energy for a given period of time, so as to produce a solid substance. The electromagnetic radiation energy to be exposed to may be the sun light and preferably may be the light of 200 to 400 nm in wavelength, including the ultra violet range. Such suitable radiation to the characteristic of the waste solution is selected for the inventive process. The waste solution can be exposed to the sun light by putting in a pad or a plate and the like to be allowed. The polymerized materials are solidified incorporating water content, and therefore, can be easily disposed. Because the resulting solid is self-burning, if the solid is burned to recover the heat energy to heat the waste solution, the waste solution can be more easily densified or concentrated by evaporating water from the solution, and the polymerization can be more easily effected. When the heat energy is applied, an indirect heating system such as drum drier is preferable, and the resulting solid is preferably picked up or scraped from the bottom of a container by a scraper. Further, the heat energy generated from burning the obtained solid can preferably aid to heat the waste solution.

The treatment tests to improve the superiority of the management of the photoresist containing waste solution in accordance with the present invention are shown in the following examples, but they should not be interpreted for the limitation of the invention.

EXAMPLE 1

Densification of the photoresist concentration in the waste solution and recycling treatment of the solution (1) Using an ultrafiltration membrane having a cut off molecular weight of 10,000, a waste solution from a developing process was subjected to an ultrafiltration under the condition of 20 kg/cm$^2$ of an operating pressure at the temperature of 20° to 30° C. to yield the solution to be recycled to the developing process. The tested regenerated solution has a constant dissolving power against the photoresist materials. The removal of the organic materials from the treated waste solution was about 80 percent. The removal will be raised if the ultrafiltration membrane with the smaller pores is used. When the ultrafiltration membrane with cut off molecular weight of 5,000 was used, the removal evidenced 85 percent. (The used ultrafiltration membrane is made from polysulfone material, and in a tabular form. The tested developing solution has contained originally 1 weight % of $Na_2CO_3$ and 0.4 volume % of antifoamer and has been used to develop an unexposed photoresist in the ratio of 0.17 m$^2$ of the photoresist per 1 liter of the developing solution at the temperature of 30° C.).

The portion of the solution passing through the ultrafiltration membrane contained organic material in 15 to 20 percent which was an antifoamer originally contained in the developing solution. About 95 percent of the original developing solution volume can be recovered.

Through this ultrafiltration, the waste solution from printed circuit boards manufacturing industries was densified or concentrated, and therefore, the volume of the waste solution was reduced into one twentieth of the volume discharged from the developing process, resulting in the reduced volume of the waste to be disposed.

Figure 3:
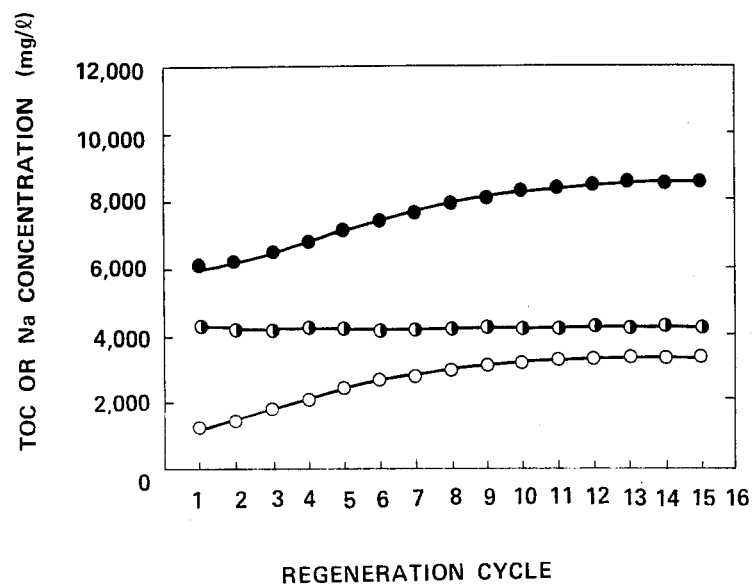
FIG. 3 is a graph showing the change of the solution regenerated and recycled repeatedly from the photoresist materials containing waste solution being treated in accordance with the present invention.

(2) Using the same developing solution as that used in (1), a test is carried out adjusting pH to 11.5 by subjecting the the developing solution to the repeated treatment with ultrafiltration in a fractional operation to recycle fifteen times, in accordance with the present invention. The each content of Na ion and the amount of TOC (Total Organic Carbon) in each repeat in the waste solution, the solution passing through an ultrafiltration membrane and the regenerated developing solution are shown in FIG. 3.

The used ultrafiltration membrane was a film manufactured from polysulfone, having cut off molecular weight of 10,000 and a film surface area of 0.012 m$^2$. The ultrafiltration was carried out under the operation pressure of 3 kg/cm$^2$, at the liquid temperature of 20° C., and in the densification magnitude of 20 times.

The composition adjustment was carried out by adding NaOH to 950 ml of the solution passing through the ultrafiltration membrane, which had been obtained from 1,000 ml of the test waste solution (pH of 10.5), until the solution become pH of 11.5, and then adding 50 ml of the fresh developing solution having the same composition as the original one to the recycled solution.

The solution was repeatedly regenerated in accordance with the present invention. It was confirmed that after the pH of the solution was adjusted at 11.5, the content of Na in the solution was constant. The solution passing through the ultrafiltration membrane raised gradually in the content of the photoresist materials dissolved (it was shown in the raise of TOC). However, it is not densified endlessly. Because the new solution of 5% was added in one repeat to the regenerated solution, the content of TOC was balanced at the level corresponding to the dilution by such addition.

Treatment of photoresist densified waste solution

Then, the resulting concentrated waste was acidified by the addition of sulfuric acid into pH of 2 to 4. Thereby, the most part of the photoresist material (90 to 95%) was precipitated. The resulting precipitation was filtered to be removed from the waste solution, and then, the resulting filtrate was acidified and subjected to reverse osmosis treatment to result in about 5 times concentration (densification) of the original waste solution and further in the filtrate with COD of below 20 mg/l, in which 99% of the dissolved photoresist material had been removed. The resulting clean filtrate is so clean that it can be put into the river or the public water range, or it can be recovered as usable water.

Polymerization treatment of photoresist material in the densified waste solution

EXAMPLE 2

A waste solution containing soluble photoresist materials discharged from a developing process for printed circuit boards manufacturing industries which original developing solution was adjusted to pH of 10.5 by the addition of $Na_2CO_3$ and the waste having TOC of 6,000 mg/l, was subjected to ultrafiltration by a polysulfone membrane having functional molecular weight of 10,000. The waste solution was densified 20 times to yield 200 ml of the densified waste solution. The resulting waste solution was put in a glass pad of 200 mm×250 mm and was exposed to the sun light. After four hours passed, the solid material of 2 mm in thickness was obtained. The resulting solid material evidenced the calorific value of 4,100 kcal/kg. at lower level and is easily incinerated.

EXAMPLE 3

A waste solution containing soluble photoresist materials from a stripping process of printed circuit boards manufacturing, which original stripping solution was adjusted at pH of 13.5 by the addition of KOH, and the TOC thereof was 10,000 mg/l was subjected to a ultrafiltration similar to that of Example 2. The resulting densified waste solution was ten times concentrated and 200 ml in volume, which was exposed to the sun light by putting to allow in a glass pad of 200 mm×250 mm. After 3.5 hours passed, the solidified material similar to that of Example 2 was yielded. The water content of the resulting solidified substance was 60 weight percent. The calorific value at the lower level was 3,600 kcal/kg. This resulting solid was burned or incinerated as in Example 2.

REFERENCE EXAMPLE 1

The 200 ml of the waste solution used in Example 2 without the treatment by the ultrafiltration membrane was exposed to the sun light in a glass pad of 200 mm×200 mm. After it was allowed to expose to the sun light for 12 hours, the content of water was decreased to 52 weight percent, but there was not found any solid in the solution. Further, it was allowed, and it was dried out after further thirteen hours remaining only powdery deposit due to the inorganic alkalizing agent.

REFERENCE EXAMPLE 2

The waste solution used in Example 2 was subjected to the ultrafiltration membrane as in Example 2 to densify five times the solution. The resulting densified solution 200 ml was exposed to the sun light in a pad of 200 mm×250 mm. After nine hours passed, the content of water was reduced to 55 weight percent, but no solid was found. Further, it was allowed, and it was dried out after further ten hours, remaining only powdery deposit due to an inorganic alkalizing agent.

REFERENCE EXAMPLE 3

The waste solution used in Example 2 was subjected to the ultrafiltration as in Example 2 to densify eight times the solution. The resulting densified solution 200 ml was exposed to the sun light in a pad of 200 mm×250 mm. After seven hours passed, the partially cured solid was found. The resulting solid incorporating white powder showed insufficient cure (polimerization).

EXAMPLE 4

The waste solution used in Example 2 was subjected to the ultrafiltration as in Example 2 to densify twenty times the solution. The resulting densified solution 200 ml was heated in the dark box for about one hour to form the water content of 57 weight %. The cured solid was found which is self-burning.

We claim:

1. A process of management of a photoresist material, containing waste solution discharged from printed circuit boards manufacturing industries, semiconductor manufacturing and printing industries using water soluble photoresist materials, which comprises:
   (a) subjecting a waste solution obtained from the treatment of photoresist materials by a treating solution containing an alkalizing agent to an ultrafiltration;
   (b) returning each permeate passing through the ultrafiltration membrane to a treating solution so as to recycle the waste solution which has been cleaned by the ultrafiltration; and
   (c) adding an alkalizing component, which is the same as the one dissociated or consumed in the treating process, to the permeate being recycled, until the pH thereof becomes the original pH value of the treating solution, before the treating of the photoresist layer on a substrate occurs.

2. The process as claimed in claim 1, wherein the treating solution includes a waste solution discharged from a developing process using a water soluble photoresist material, and a waste solution discharged from a stripping process which strips photoresist material.

3. A process of treatment of a photoresist material containing waste solution discharged from printed circuit boards manufacturing industries, semiconductor manufacturing and printing industries using a water soluble photoresist material, which comprises:
   (a) subjecting waste solutions discharged from treating processes of photoresist material including a photoresist developing process and a photoresist stripping process, to an ultrafiltration, so as to concentrate the photoresist materials in the waste solution; and
   (b) exposing the resulting photoresist material concentrated waste solution to electromagnetic radiation, so as to polymerize or cure the photoresist materials as dissolved in the solution, thereby producing a solidified substance incorporating a polymerized substance and water.

4. The process of the treatment of a water soluble photoresist material containing waste solution as claimed in claim 3, which further comprises: burning the resulting solidified substance to produce thereby heat of combustion so as to evaporate water from the waste solution, thereby accelerating the polymerization of the waste photoresist materials as dissolved in the solution.

* * * * *